ND

United States Patent
Groe

(12) United States Patent
(10) Patent No.: US 7,450,915 B1
(45) Date of Patent: Nov. 11, 2008

(54) SMART TRANSMITTER SYSTEM

(75) Inventor: John Groe, Poway, CA (US)

(73) Assignee: Sequoia Communications, San Diego, CA (US)

( * ) Notice: Subject to any disclaimer, the term of this patent is extended or adjusted under 35 U.S.C. 154(b) by 412 days.

(21) Appl. No.: 11/025,773

(22) Filed: Dec. 27, 2004

Related U.S. Application Data

(60) Provisional application No. 60/533,878, filed on Dec. 27, 2003.

(51) Int. Cl.
  *H01Q 11/12* (2006.01)
  *H04B 1/04* (2006.01)
  *H03F 3/38* (2006.01)
  *H03G 5/16* (2006.01)

(52) U.S. Cl. ................. 455/127.2; 455/127.3; 455/108; 330/10; 330/133

(58) Field of Classification Search ............ 455/127.2, 455/127.3, 102, 108, 110, 241.1, 251.1, 245.1; 330/10, 254, 133, 134
See application file for complete search history.

(56) References Cited

U.S. PATENT DOCUMENTS

| | | | | |
|---|---|---|---|---|
| 4,198,675 A * | 4/1980 | Moore | ................ | 702/124 |
| 4,263,560 A * | 4/1981 | Ricker | ................ | 330/129 |
| 4,816,772 A * | 3/1989 | Klotz | ................ | 330/254 |
| 5,307,512 A * | 4/1994 | Mitzlaff | ................ | 455/126 |
| 5,451,901 A * | 9/1995 | Welland | ................ | 330/133 |
| 5,926,749 A * | 7/1999 | Igarashi et al. | ................ | 455/127.2 |
| 6,011,437 A * | 1/2000 | Sutardja et al. | ................ | 330/254 |
| 6,043,707 A * | 3/2000 | Budnik | ................ | 330/10 |
| 6,069,525 A * | 5/2000 | Sevic et al. | ................ | 330/51 |
| 6,256,482 B1 * | 7/2001 | Raab | ................ | 455/108 |
| 6,259,321 B1 * | 7/2001 | Song et al. | ................ | 330/254 |
| 6,295,442 B1 * | 9/2001 | Camp et al. | ................ | 455/102 |
| 6,333,675 B1 * | 12/2001 | Saito | ................ | 330/133 |
| 6,438,360 B1 * | 8/2002 | Alberth et al. | ................ | 455/110 |
| 6,445,247 B1 * | 9/2002 | Walker | ................ | 330/10 |
| 6,559,717 B1 * | 5/2003 | Lynn et al. | ................ | 330/133 |
| 6,711,391 B1 * | 3/2004 | Walker et al. | ................ | 455/234.1 |
| 6,744,319 B2 * | 6/2004 | Kim | ................ | 330/254 |
| 6,791,413 B2 * | 9/2004 | Komurasaki et al. | ................ | 330/254 |
| 6,822,523 B2 * | 11/2004 | Grosspietsch et al. | ................ | 332/149 |
| 6,972,626 B2 * | 12/2005 | Takahashi et al. | ................ | 330/279 |
| 7,046,087 B1 * | 5/2006 | Naik et al. | ................ | 330/136 |
| 7,065,334 B1 * | 6/2006 | Otaka et al. | ................ | 455/232.1 |
| 7,184,491 B2 * | 2/2007 | Suzuki et al. | ................ | 375/297 |
| 2002/0177420 A1 * | 11/2002 | Sander et al. | ................ | 455/108 |
| 2004/0113686 A1 * | 6/2004 | Dupuis et al. | ................ | 330/140 |

* cited by examiner

*Primary Examiner*—Duc M Nguyen
(74) *Attorney, Agent, or Firm*—Daniel Tagliaferri; Cooley Goodward Kronish LLP

(57) ABSTRACT

Smart transmitter system that includes apparatus for an automatic gain control circuit. The apparatus includes a circuit translates a transmit power control signal to produce a linear signal, and a first mapping circuit that maps the linear signal to a first control signal that is coupled to a variable gain amplifier (VGA). The apparatus also includes a power amplifier (PA) control circuit that receives the linear signal and a transmit signal to produce a second control signal that is coupled to a power amplifier.

24 Claims, 9 Drawing Sheet

SMART TRANSMITTER SYSTEM

CROSS REFERENCE TO RELATED APPLICATIONS

The present application claims the benefit of priority from a U.S. Provisional Patent Application entitled "SMART TRANSMITTER SYSTEM" having Ser. No. 60/533,878 and filed on Dec. 27, 2003, the disclosure of which is incorporated by reference herein for all purposes.

FIELD

The present invention relates generally to wireless transmitters, and more particularly, to wireless transmitters employing gain and/or power control.

BACKGROUND

A wireless transmitter translates modulated signals into a format suitable for radio transmission, shifts the carrier to microwave frequencies, and adjusts the output power level.

The transmit power level is especially important in self-interfering systems, such as in code division multiple access (CDMA) systems. This is because other users that share the same frequency channel are treated as noise. Consequently, power control is essential, with the output level rarely reaching its peak and typically following a distribution like the one shown in FIG. 1.

Most wireless transmitters require power amplifiers to reach peak power levels. The power amplifier may have to produce up to 1 watt of power without adding noise, with minimal spectral regrowth and little sensitivity to large standing waves caused by antenna reflections. Due to these design constraints, the power amplifier is invariably optimized for peak power performance and is generally less efficient at lower power levels. This is important because the power amplifier consumes more power than any other circuit in a communication system.

It would therefore be advantageous to have a system that improves the power efficiency of the transmitter and power amplifier at all output power levels.

SUMMARY

In one or more embodiments, a smart transmitter system is provided that includes an automatic gain control (AGC) network that uses information about the transmit signal to set an operating bias of a power amplifier, thereby improving the power efficiency of the transmitter and power amplifier at all output power levels.

In one embodiment, apparatus is provided for an automatic gain control circuit. The apparatus comprises a circuit that translates a transmit power control signal to produce a linear signal, and a first mapping circuit that maps the linear signal to a first control signal that is coupled to a variable gain amplifier (VGA). The apparatus also comprises a power amplifier (PA) control circuit that receives the linear signal and a transmit signal to produce a second control signal that is coupled to a power amplifier.

In one embodiment, apparatus is provided for an automatic gain control circuit. The apparatus comprises means for translating a transmit power control signal to produce a linear signal, and means for mapping the linear signal to a first control signal that is coupled to a variable gain amplifier. The apparatus also comprises means for receiving the linear signal and a transmit signal to produce a second control signal that is coupled to a power amplifier In one embodiment, a communication device is provided that comprises apparatus for providing an automatic gain control circuit. The apparatus comprises a circuit that translates a transmit power control signal to produce a linear signal, and a first mapping circuit that maps the linear signal to a first control signal that is coupled to a variable gain amplifier. The apparatus also comprises a power amplifier control circuit that receives the linear signal and a transmit signal to produce a second control signal that is coupled to a power amplifier.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

In one or more embodiments, a smart transmitter system is provided that includes an automatic gain control (AGC) network that uses information about the transmit signal to set an operating bias of a power amplifier. The power amplifier may consist of two or three gain stages with interstage matching networks. Each gain stage may be realized as a simple common-emitter (using bipolar technology) or common source (using FET technology) amplifier.

Figure 1:
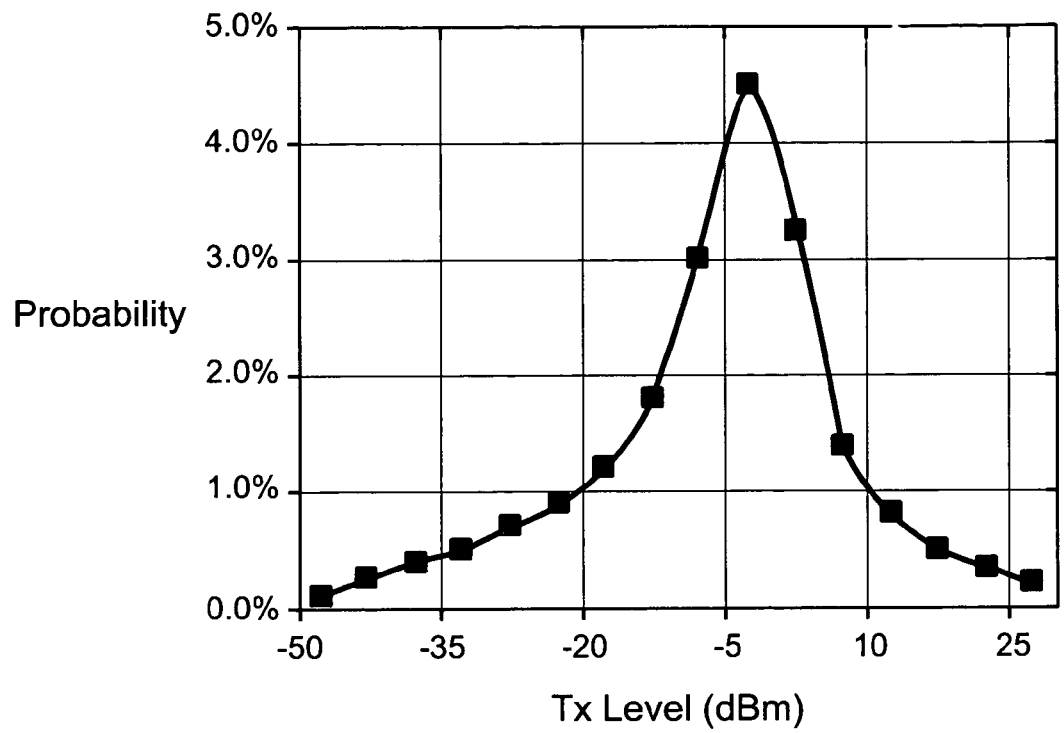
FIG. 1 shows a graph that illustrates a probability distribution for the transmit power level in a CDMA system.
Figure 2:
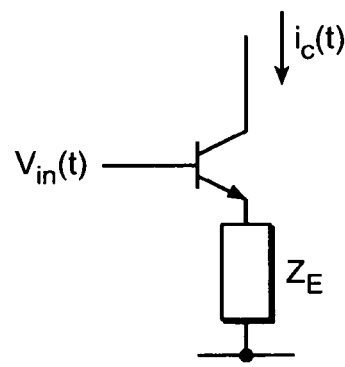
FIG. 2 shows a diagram of a common-emitter amplifier stage.

FIG. 2 shows a diagram of a common-emitter amplifier stage. The bipolar transistor is governed by the expression;

$$I_c = I_s e^{\left(\frac{V_{be}}{V_T}\right)}$$

where $I_c$ is the collector current, $I_s$ is the saturation current, $V_{be}$ is the base-emitter voltage, and $V_T$ is the thermal voltage. The amplifier's intrinsic gain or transconductance is defined as;

$$g_m(t) = \frac{\partial I_c(t)}{\partial v_{in}(t)} = \frac{I_{cq}}{V_T} e^{\left(\frac{V_{in}(t)}{V_T}\right)}$$

which depends on the quiescent current $I_{cq}$, (The subscript q denotes quiescent.) Note that both $I_c$ and $g_m$, vary exponentially and nonlinearly. Furthermore, the distortion grows as the amplitude of $v_{in}(t)$ increases.

In the amplifier of FIG. 2, the input voltage forms across the transistor's base-emitter junction and the impedance element $Z_e$ with;

$$v_{in}(t) = V_T \ln\left(\frac{I_{cq} + i_c(t)}{I_s}\right) + i_c(t) Z_e$$

The element $Z_e$ develops a voltage proportional to the output collector current, introducing negative feedback that lowers the distortion as well as the gain of the amplifier. Rewriting this expression reveals;

$$v_{in}(t) = V_{beq} + V_T \ln\left(1 + \frac{i_c(t)}{I_{cq}}\right) + i_c(t) Z_e$$

which shows that the distortion depends on the ratio of the peak signal current $i_c(t)$ to the quiescent operating current $I_{cq}$ plus the value of the degeneration impedance $Z_e$.

In practice, large-amplitude input signals shift the operating point of the transistor higher. This occurs when the amplifier transitions from class A operation (collector output current conducts during full cycle) to class AB operation (collector current turns off at negative peaks). During class AB operation, the amplifier and transistor self-bias, with the actual quiescent current strongly dependent on the input signal's amplitude and the impedance $Z_e$.

The power amplifier boosts the level of the transmit signal $V_{in}(t)$. This signal consists of an RF carrier and modulation—the modulation being amplitude, phase, or a combination thereof.

Figure 3:
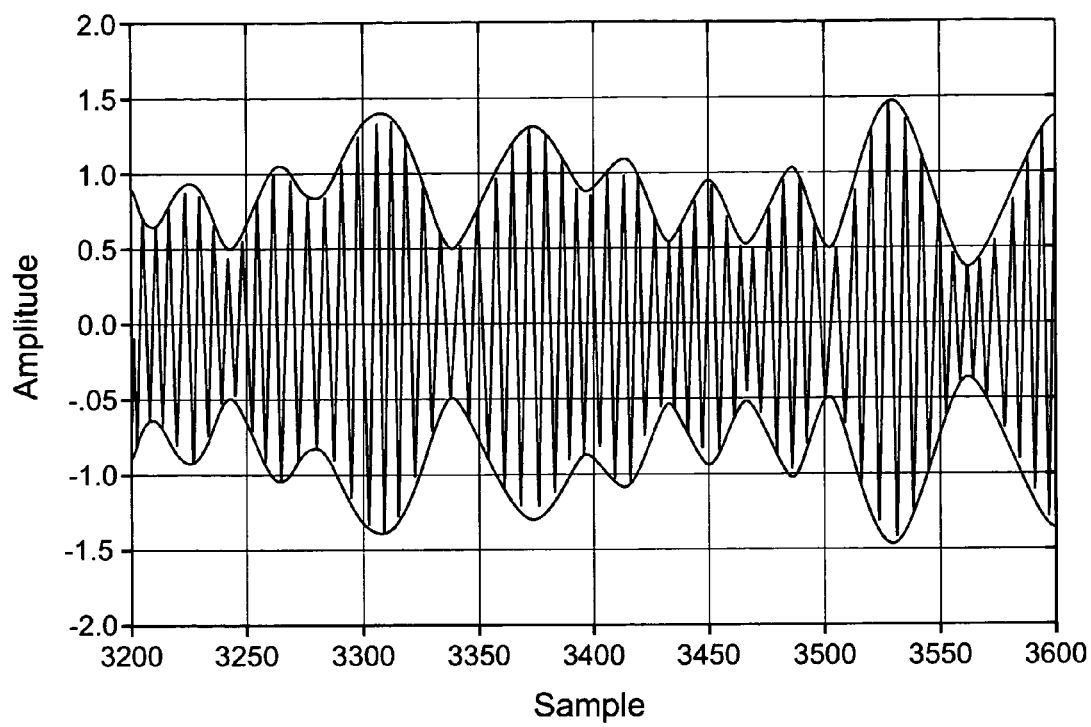
FIG. 3 shows a graph that illustrates a transmit signal with envelope modulation.

FIG. 3 shows a graph that illustrates how amplitude modulation changes an envelope characteristic of a transmit signal. The envelope variation, characterized by the peak-to-average ratio (PAR), depends on the modulation method. PAR is defined by;

$$PAR = 10\log\left(\frac{P_{pk}}{P_{rms}}\right)$$

where $P_{pk}$ is the peak power and $P_{rms}$ is the rms power of the transmit signal. The rms level of a complex, modulated signal is analyzed using the following expression;

$$P_{rms} = \frac{1}{T} \int_T m^2(t) \cos^2[\omega_c t + \theta(t)] dt$$

with the time t covering multiple symbols. The peak-to-average ratio tends to increase as the data rate in a given bandwidth increases. For example, systems commonly referred to as "third generation" (3G) communication systems show a peak-to-average ratio in the range of 5-9 dB, while systems commonly referred to as "orthogonal frequency division multiplex" (OFDM) communication systems show higher values, approaching 12 dB and higher. As such, the quiescent operating point of the power amplifier should shift with output power as well as the peak-to-average ratio to ensure linear amplification. This ensures the peak value of $i_c(t)$ remains a fraction of the quiescent operating current $I_{cq}$.

A power amplifier should operate linearly otherwise it spreads energy outside of the bandwidth of the modulation signal (a phenomenon known as spectral regrowth). This adversely affects other users and lowers system capacity.

Figure 4:
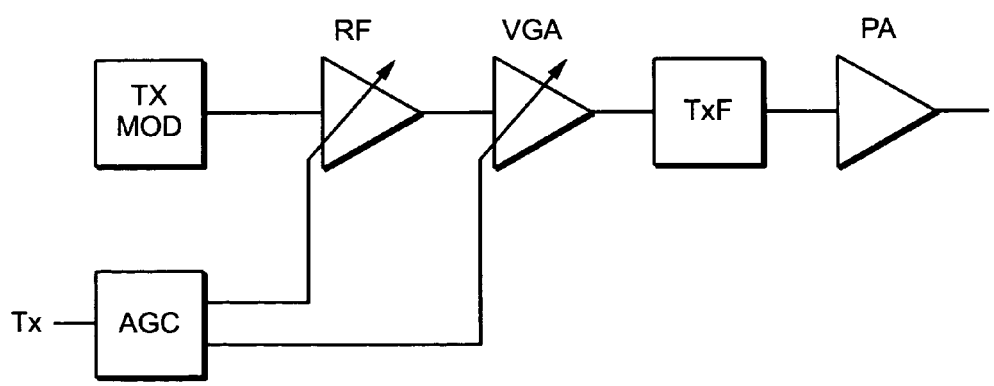
FIG. 4 shows a diagram of one embodiment of a transmitter and associated AGC network.

FIG. 4 shows a diagram of one embodiment of a transmitter and associated AGC network. The transmit power level provided at the output of the power amplifier (PA) is set by the AGC network. The AGC network controls the gain of the variable gain amplifiers independently to optimize performance. The AGC uses the Tx control signal (representing the power of the transmitted signal in dB) to adjust the system gain. This becomes especially important in self-interfering systems, which require precision and wide-range power control. Embodiments of the smart transmitter system use the peak-to-average characteristics of the transmit signal to optimally set the operating point of the power amplifier and thereby maximize the efficiency of the transmitter.

Figure 5:
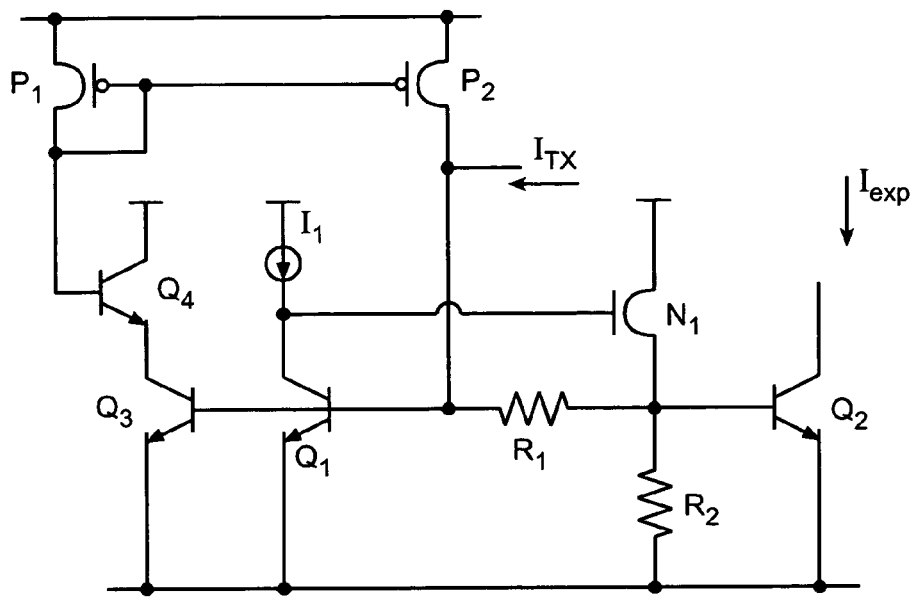
FIG. 5 shows a diagram of one embodiment of an exponential current generator.

FIG. 5 shows a diagram of one embodiment of an exponential current generator. Since most variable gain amplifiers require linear control, the Tx signal must first be converted from dB to linear format. The exponential generator shown in FIG. 5 accomplishes this. Current $I_1$ develops a base-emitter voltage across transistor $Q_1$ that mirrors to transistor $Q_2$ through resistor $R_1$. The resulting loop equation is;

$$V_{be1} = I_{Tx} R_1 + V_{be2}$$

where $I_{Tx}$ is a power control signal that is proportional to the required gain. This equation can be rewritten as;

$$I_{exp} = I_1 \exp\left(-\frac{I_{Tx} R_1}{V_T}\right)$$

where $V_T$ is the thermal voltage. The transistor loop consisting of devices $Q_3$-$Q_4$ and $P_1$-$P_2$. $P_2$ biases transistor $Q_1$, while transistor $N_1$ provides the base current for transistor $Q_2$. Resistor $R_2$ provides a current source for transistor $N_1$.

Figure 6:
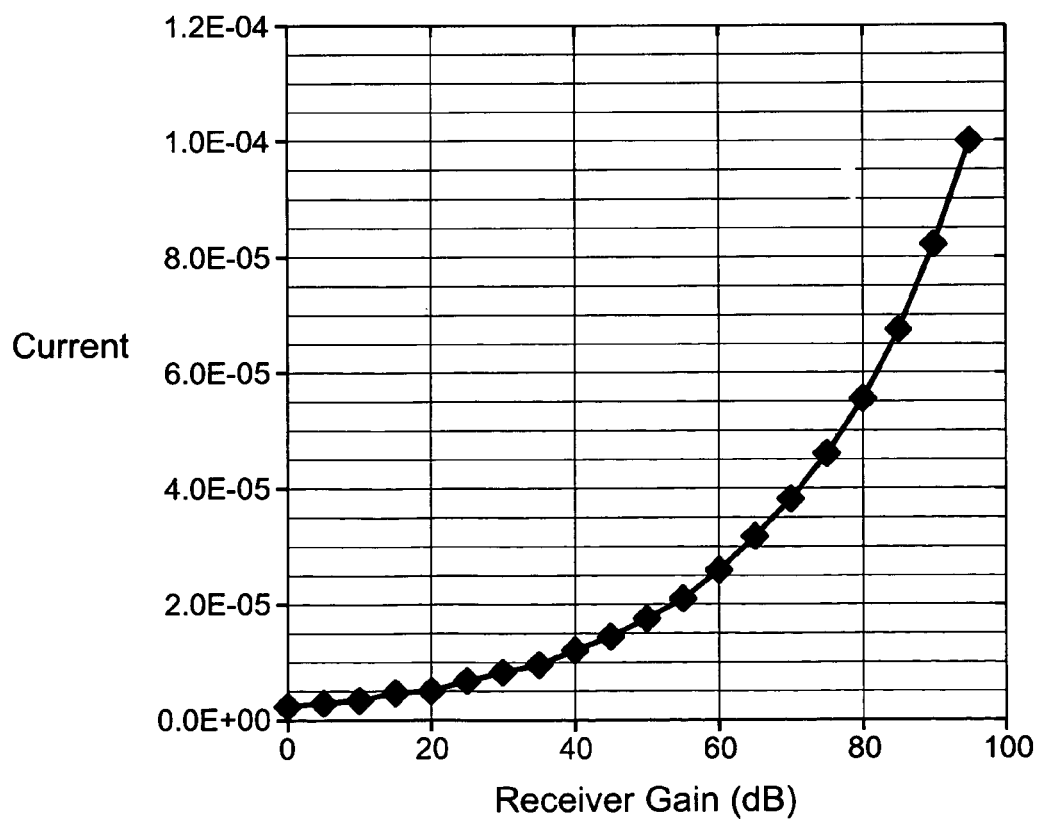
FIG. 6 shows a graph that illustrates the exponential current produced by the exponential current generator of FIG. 5.

FIG. 6 shows a graph that illustrates the exponential current $I_{exp}$ produced by the exponential current generator of FIG. 5.

Figure 7:
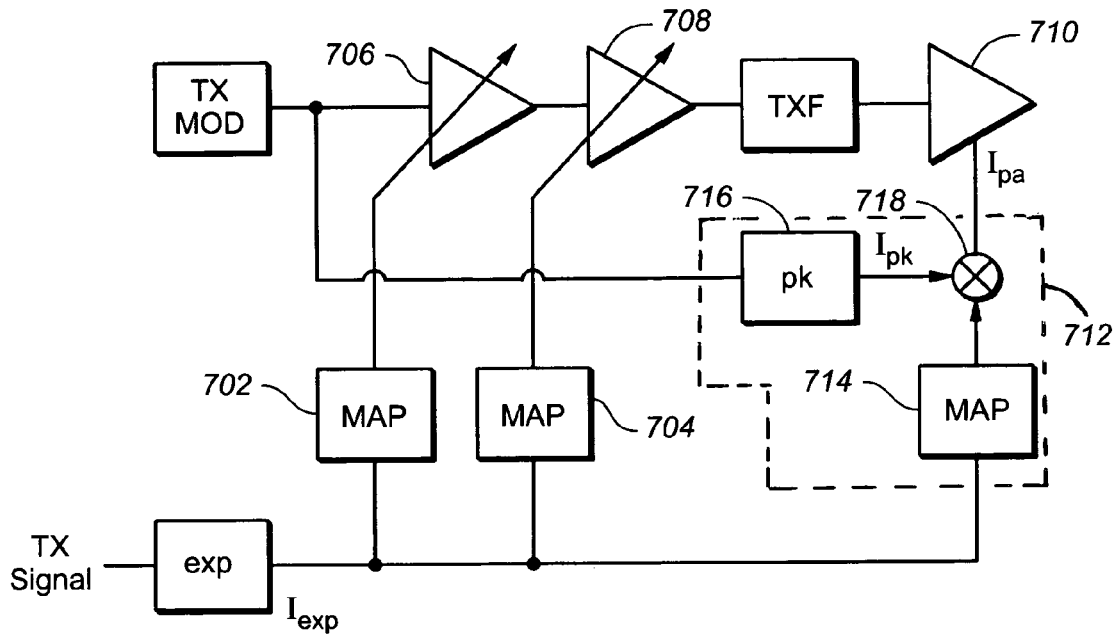
FIG. 7 shows a diagram of one embodiment of an AGC network and associated mapping circuits.

FIG. 7 shows a diagram of one embodiment of an AGC system and associated mapping circuits for use in one or more embodiments of a smart transmitter system. The exponential current $I_{exp}$ forms a basis that maps to multiple control circuits and their associated variable gain amplifiers as illustrated in the AGC system shown in FIG. 7. For example, the mapping circuits 702, 704 receive the exponential current $I_{exp}$ and produce control signals that control the operation of the variable gain amplifiers 706, 708, respectively. A power amplifier control circuit 712 analyzes the peak-to-average ratio characteristics of the transmit signal. This is readily available from the amplitude modulation signal. For example, the mapping circuit 714 receives the exponential current $I_{exp}$ to produce a control signal that is input to a signal combiner 718. Additionally, a peak detector circuit 716 receives a transmit modulation signal and produces a peak signal ($I_{pk}$) that is also input to the combiner 718. The combiner 718 combines the two input signals to produce a power amplifier control signal ($I_{pa}$) that is input to a power amplifier 710.

It is important to realize that an amplifier's gain is affected by its operating bias strongly in class A regime and less so in class AB operation (due to self biasing effects). This means, any adjustment to the power amplifier's bias current shifts its gain and therefore requires compensation elsewhere in the transmitter.

Figure 8:
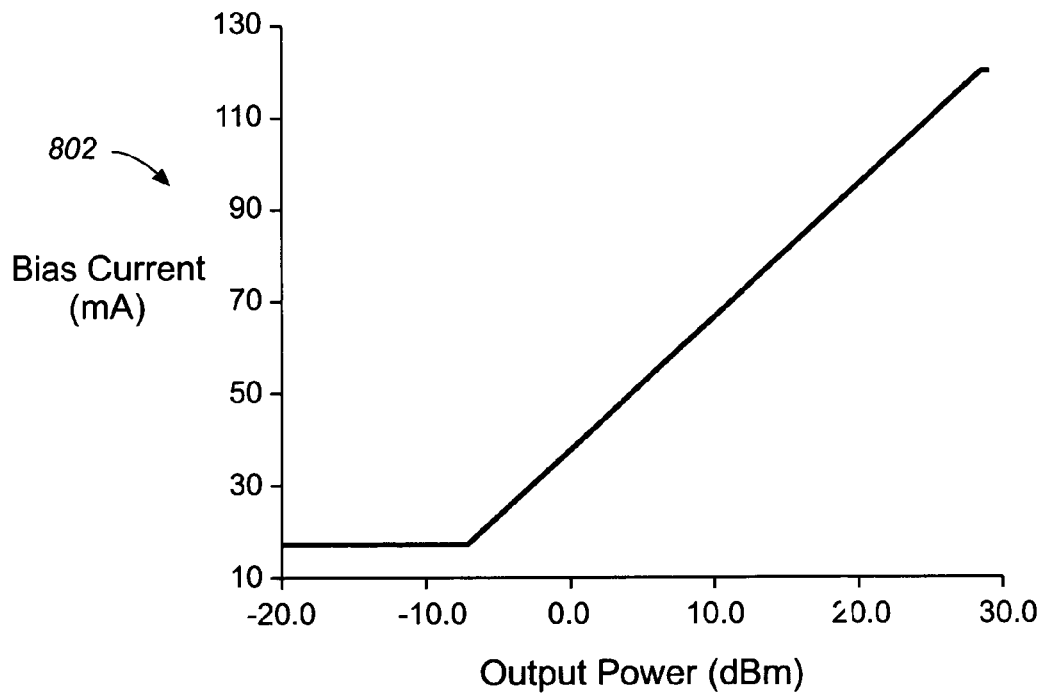
FIG. 8 shows plots that illustrate the effects of bias on the linearity and gain of a power amplifier.
Figure 8:
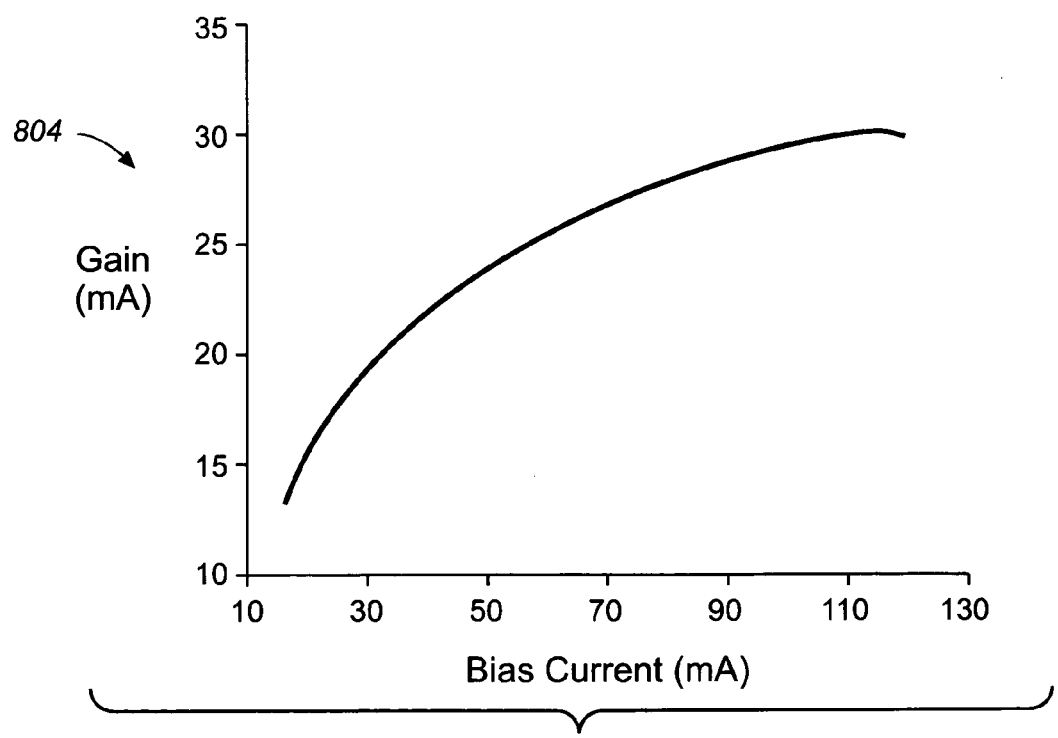

FIG. 8 shows a graph 802 of the minimum bias current required by the power amplifier (PA) to satisfy distortion limits (for a transmit signal with constant modulation parameters). Although the required bias current follows a linear trajectory, it results in a parabolic gain curve (as shown in graph 804) with;

$$G_{pa} = \beta \sqrt{I_{pa}}$$

where $G_{pa}$ is the gain of the PA and $\beta$ is a gain constant dependent on the power amplifier. Consequently, the gain of the preceding RF variable gain amplifier (or amplifiers) must change oppositely such that the gain of the transmitter satisfies $$G_{Tx} = G_{vga} G_{pa} = \alpha \sqrt{I_{exp}} \beta \sqrt{I_{exp}}$$

and varies linearly with $I_{exp}$.

Figure 9:
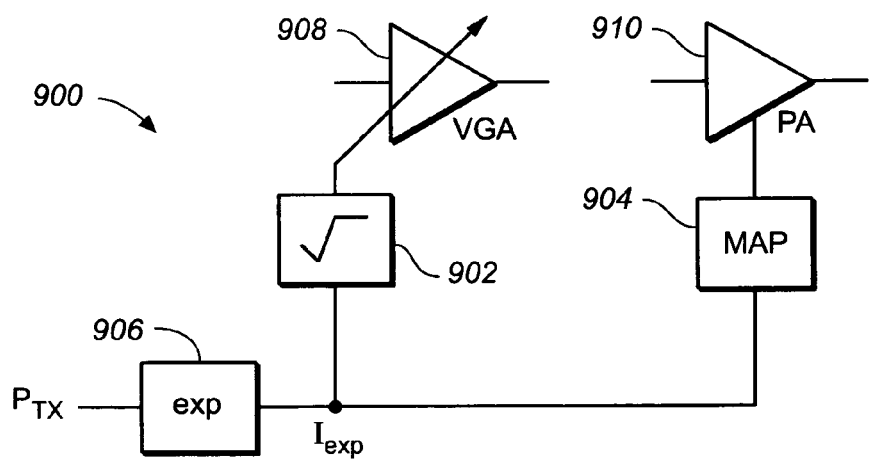
FIG. 9 shows a diagram of one embodiment of a system used to control the bias of the power amplifier and to compensate for its gain variations.

FIG. 9 shows a diagram of one embodiment of a system 900 used to control the bias of a power amplifier and to compensate for its gain variations. The system 900 comprises a square-root circuit 902, and a mapping circuit 904. An exponential circuit 906 converts a transmit power signal ($P_{TX}$) to an exponential current $I_{exp}$ that is input to the square-root circuit 902 and the mapping circuit 904. The square-root circuit 902 produces a control signal that controls a variable gain amplifier 908 and the map circuit 904 outputs a control signal that controls a power amplifier 910. The gain of the system 900 can be expressed as follows;

$$G_{Tx} = \alpha \beta I_{exp}$$

Figure 10:
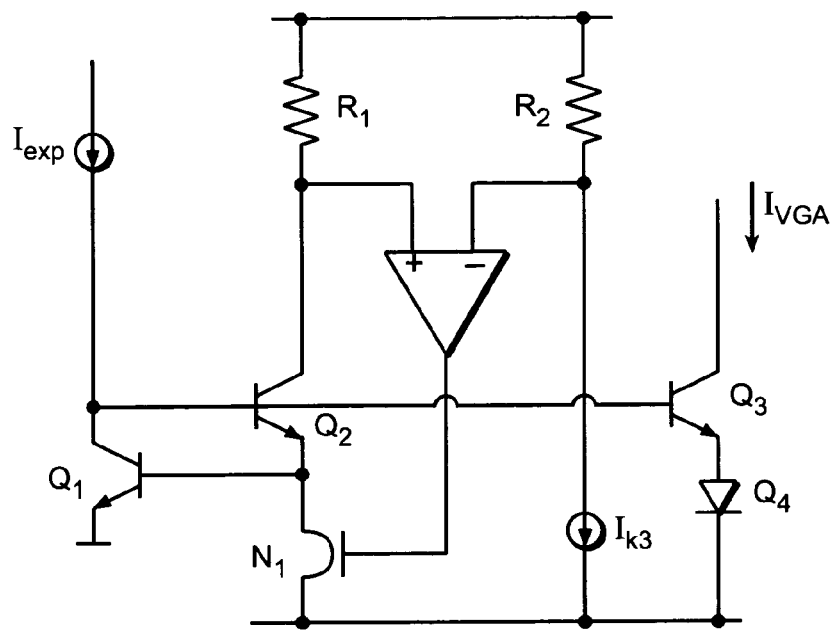
FIG. 10 shows a diagram of one embodiment of a square-root circuit.

FIG. 10 shows a diagram of one embodiment of the square-root circuit 902. The square root function is realized with a translinear circuit. It uses operational amplifier feedback to create a constant current source. Transistors $Q_1$-$Q_4$ form the translinear loop where;

$$I_{Q1} I_{Q2} = (I_{Q3})^2$$

The input current $I_{in}$ biases transistor $Q_1$, while a constant current $I_{k3}$ is established in transistor $N_1$. As a result;

$$I_{Q3} = \sqrt{I_{in} I_{k3}}$$

which is the desired square-root operation. Note that $I_{Q3}$ is also ($I_{VGA}$, which is the control signal used to the control the VGA 908.

Figure 11:
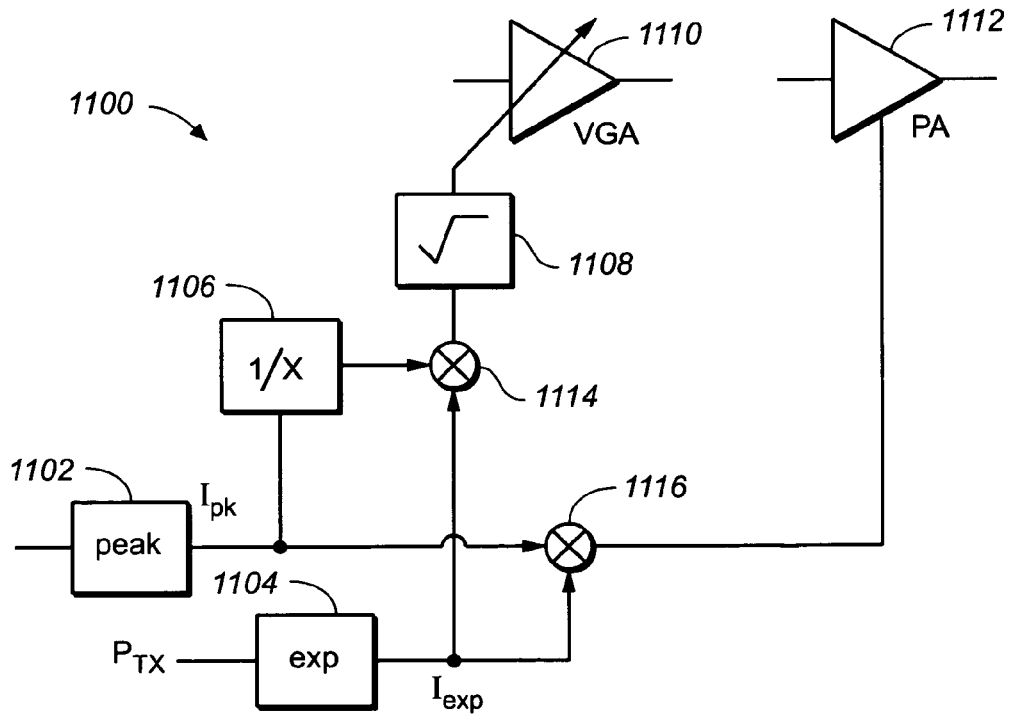
FIG. 11 shows a diagram of one embodiment of a system used to control the bias of the power amplifier that tracks the peak-to-average ratio of the transmit signal and compensates for the gain variations.

FIG. 11 shows a diagram of one embodiment of a system 1100 used to control the bias of the power amplifier by tracking the peak-to-average ratio of the transmit signal and compensating for the gain variations. The system 1100 comprises a peak detector 1102, exponential generator 1104, dividing circuit 1106, square-root circuit 1108, VGA 1110, power amplifier 1112, and signal combiners 1114 and 1116.

The system 1100 adjusts the power amplifier's bias current according to the amplitude modulation factor to satisfy the linearity requirements. Accordingly, $$G_{Tx} = G_{vga} G_{pa} = \alpha \sqrt{\frac{I_{exp}}{I_{pk}}} \beta \sqrt{I_{pk} I_{exp}}$$

which also displays linear power control. Note that the linearity of the VGA should be adequate at very high peak to average ratios.

Figure 12:
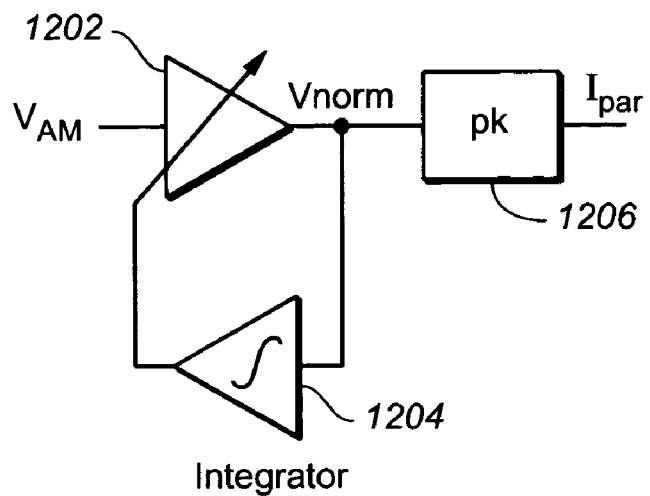
FIG. 12 shows one embodiment of a circuit that operates to determine the peak-to-average ratio of an amplitude modulated signal.

FIG. 12 shows a diagram of an amplitude modulation circuit that analyzes the peak-to-average ratio of an amplitude-modulated signal. It uses a variable gain amplifier 1202 and feedback network to normalize the rms level of the input amplitude signal. The integrator 1204 acts as an averaging filter that tracks the rms level of the signal $v_{norm}$ and drives the variable gain amplifier 1202 such that the average or rms value of $v_{norm}$ approaches a constant level. In one or more embodiments, the time constant of the integrator should be significantly larger than the period of the amplitude modulation signal $v_{AM}$. The signal $v_{norm}$ is then input to a peak detector circuit 1206 to produce the peak-to-average ratio signal $I_{par}$.

Figure 13:
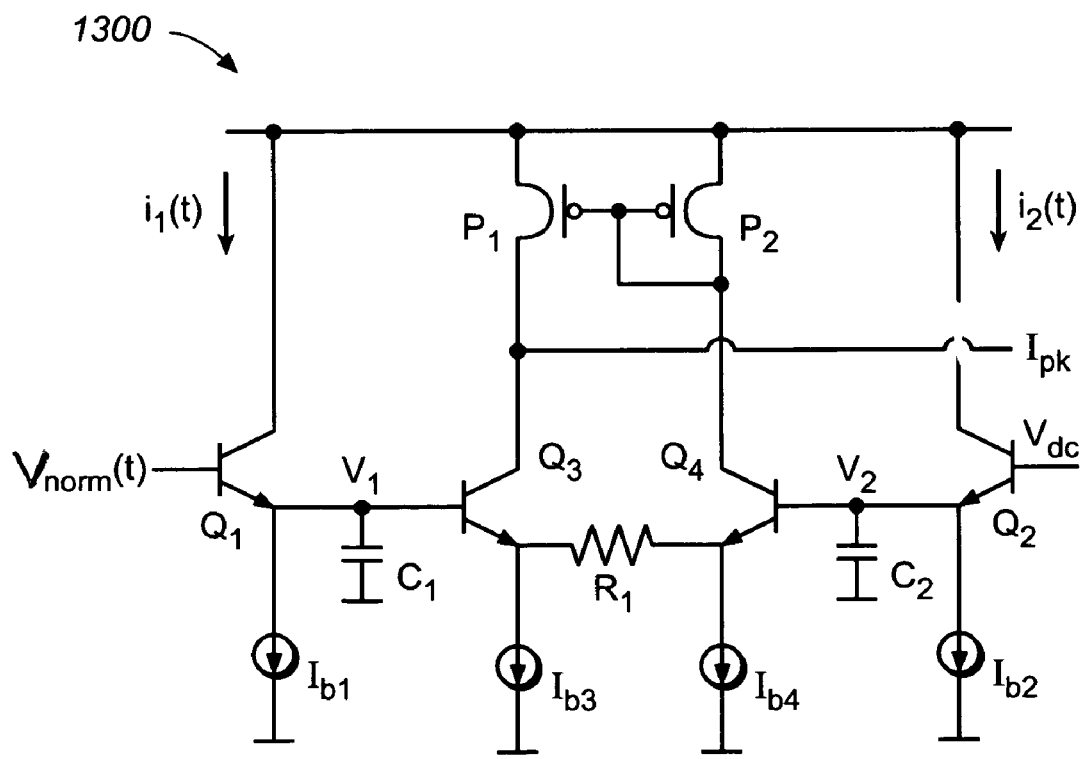
FIG. 13 shows a diagram of one embodiment of a peak detector.

FIG. 13 shows a diagram of one embodiment of a peak detector 1300. For example, the peak detector 1300 is suitable for use as the peak detector 1206. The detector 1300 acts a fast-attack, slow-decay circuit that captures the peak values of the input signal applied to transistor $Q_1$. This device rectifies the input signal $v_{norm}(t)$, and conducts current only when the input signal forward biases transistor $Q_1$. When this occurs, the transistor conducts enough current to re-charge capacitor $C_1$ and also satisfy the current source $I_{b1}$. This current is given by;

$$i_1(t) = I_s \exp\left(\frac{v_{norm}(t) - V_1}{V_T}\right)$$

where $V_1$ is the voltage stored by the capacitor $C_1$.

When $v_{norm}(t)$ is too small to forward bias transistor $Q_1$, current $i_1$ approaches zero and the bias current $I_{b1}$ discharges the voltage stored by capacitor $C_1$ with;

$$\Delta V_1 = \frac{I_{b1}}{C_1} \Delta t$$

where $\Delta t$ is the time transistor $Q_1$ is off. This discharging affects the equilibrium level of $V_1$. Nevertheless, the exponential relationship of $i_1$ to the peak value of $v_{norm}(t)$ means that the level of $V_1$ is approximately;

$$V_1 = v_{n(pk)} + V_{ref} - V_T \ln\left(\frac{I_1}{I_s}\right)$$

where $v_{n(pk)}$ is the peak amplitude of the input signal and $V_{dc}$ is the dc bias.

Transistor $Q_2$ sets up a reference level $V_2$ that depends only on the dc bias $V_{dc}$. As a result, the differential voltage $V_1 - V_2$ becomes;

$$V_1 - V_2 = v_{norm(pk)} - V_{be1}$$

which has some small dependency on the charging current $i_1$. This differential voltage in turn drives the linearized transconductance amplifier consisting of transistors $Q_3$-$Q_4$, resistor $R_1$ and current sources $I_{b3}$-$I_{b4}$, to produce the currents $I_3$ and $I_4$ that may be expressed as;

$$I_3 = I_{b3} + \frac{1}{R_1}(V_1 - V_2) \text{ and } I_4 = I_{b4} - \frac{1}{R_1}(V_1 - V_2)$$

The current mirror formed by transistors $P_1$-$P_2$ subtracts current $I_4$ from current $I_3$ to yield the output current;

$$I_{pk} = 2\frac{v_{norm(pk)}}{R_1}$$

which scales with the peak to normalized (average) ratio of the signal.

Figure 14:
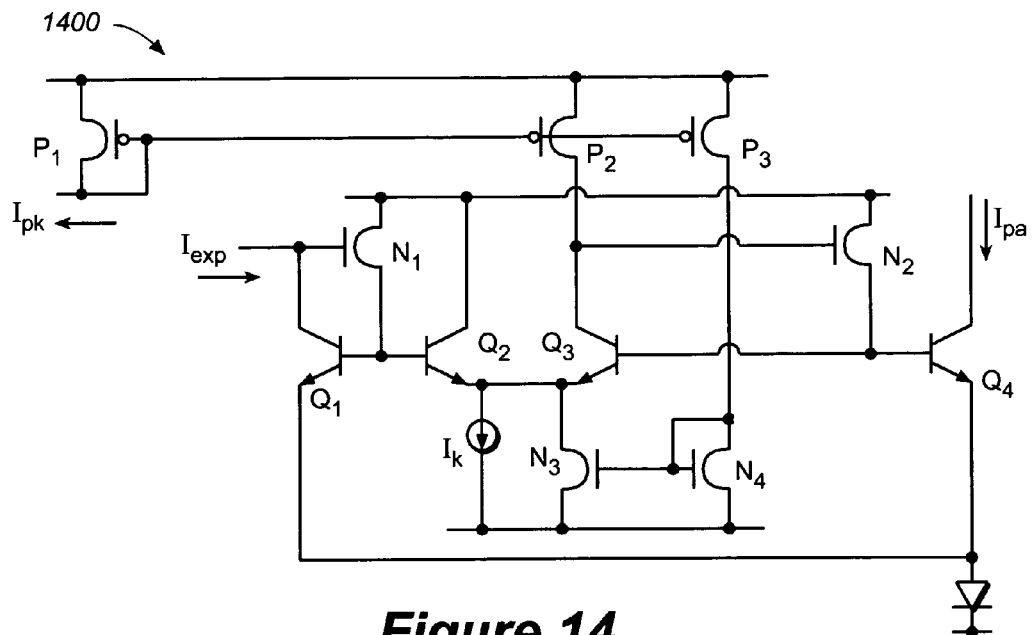
FIG. 14 shows a diagram of one embodiment of a variable current mirror used to combine the power control and peak-to-average ratio characteristics.

FIG. 14 shows a diagram of one embodiment of a variable current mirror 1400 that operates to combine the power control and peak-to-average ratio characteristics. For example, the current mirror 1400 is suitable for use as the signal combiner 1116 in FIG. 11. The variable current mirror 1400 receives as input the peak signal $I_{pk}$ and the exponential current $I_{exp}$ to produce and scale the bias control signal ($I_{pa}$) applied to the power amplifier, which normally tracks the transmit power level. It uses an adjustable voltage drop—created by transistors $Q_3$ and $Q_4$—between current mirror transistors $Q_1$ and $Q_2$ of the current mirror. This results in the loop equation;

$$V_{be1} - V_{be2} + V_{be3} = V_{be4}$$

The current flowing through transistor $Q_1$ is the transmit power signal $I_{exp}$ before scaling. Current mirrors ($P_1$-$P_3$ and $N_3$-$N_4$) force the constant current $I_k$ to flow through transistor $Q_2$ and the current $I_{pk}$ to flow through transistor $Q_3$. The expression expands to;

$$V_T \ln\left(\frac{I_{exp}}{I_s}\right) - V_T \ln\left(\frac{I_k}{I_s}\right) + V_T \ln\left(\frac{I_{pk}}{I_s}\right) = V_T \ln\left(\frac{I_{pa}}{I_s}\right)$$

which simplifies to;

$$I_{pa} = \frac{I_{exp} I_{pk}}{I_k}$$

As a result, the current $I_{pa}$ indicates the quiescent operating current needed by the power amplifier to linearly amplify the peak amplitudes of the modulated signal without spectral regrowth.

Figure 15:
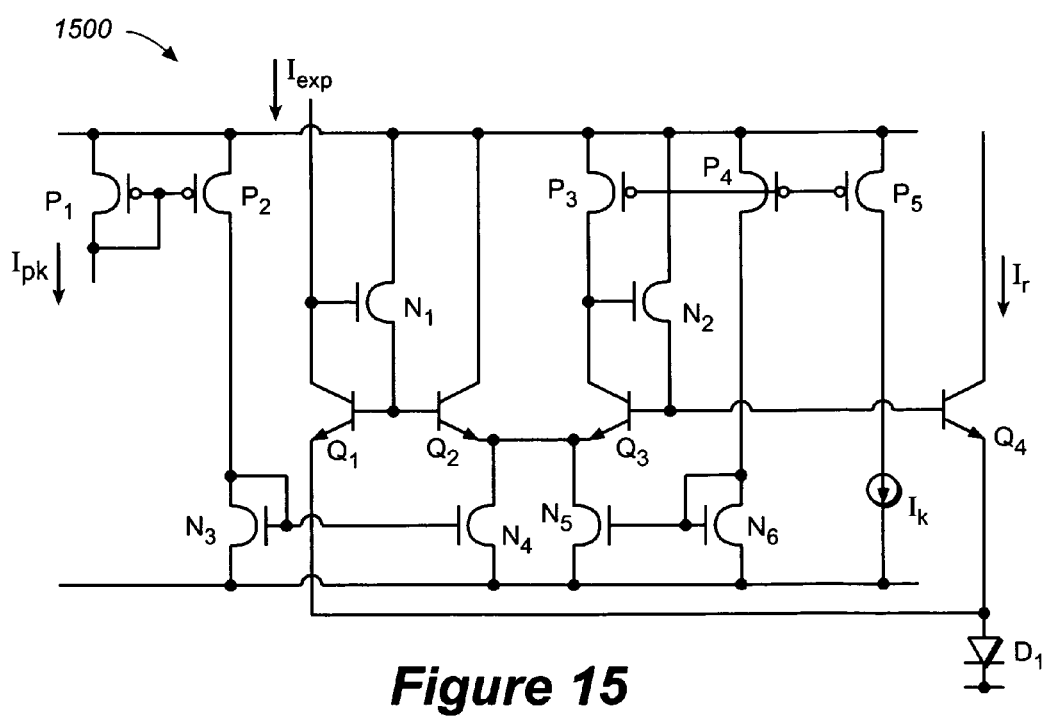
FIG. 15 shows a diagram of one embodiment of a variable current mirror used to form a compensating control signal and combine it with a power control signal.

FIG. 15 shows a diagram of one embodiment of a variable current mirror 1500 used to form a compensating control signal and combine it with a power control signal. For example, the current mirror 1500 is suitable for use at the reciprocal circuit 1106. The current mirror of FIG. 15 acts as a second variable current mirror that generates a reciprocal of the peak current $I_r$ needed to control a variable gain amplifier that compensates for shifts in the power amplifier gain. The peak current $I_{pk}$ is mirrored by transistors $P_1$-$P_2$ and $N_3$-$N_4$ to bias transistor $Q_2$, while the power control signal $I_{exp}$ biases transistor $Q_1$. A constant current $I_k$ is forced through transistor $Q_3$. This results in the loop expression;

$$V_{be1} - V_{be2} + V_{be3} - V_{be4} =$$
$$V_T \ln\left(\frac{I_{exp}}{I_s}\right) - V_T \ln\left(\frac{I_{pk}}{I_s}\right) + V_T \ln\left(\frac{I_k}{I_s}\right) - V_T \ln\left(\frac{I_r}{I_s}\right) = 0$$

which can be simplified to;

$$I_r = \frac{I_{exp} I_k}{I_{pk}}$$

The result is the current $I_r$ tracks the reciprocal of the peak current $I_{pk}$ and varies linearly with the power control signal $I_{exp}$.

The reciprocal circuit (FIG. 15) in turn feeds the square root circuit 1108 (shown in FIG. 11) using the PFET current mirror. It forces the input current $I_r$ through transistor $Q_1$. It also uses an operational amplifier to bias transistor $Q_2$ at a constant current $I_k$ and independent of the drain voltage applied to transistor $N_1$, which varies with the current in transistor $Q_1$. Using the translinear principle, $$I_{Q1} I_{Q2} = I_{Q3} I_{Q4} = (I_{vga})^2$$

which can be rewritten as;

$$I_{vga} = \sqrt{\frac{I_k I_{exp}}{I_{pk}}}$$

since $I_{vga}$ equals the current in transistor $Q_3$. This results in the needed bias current for the variable gain amplifier.

Figure 16:
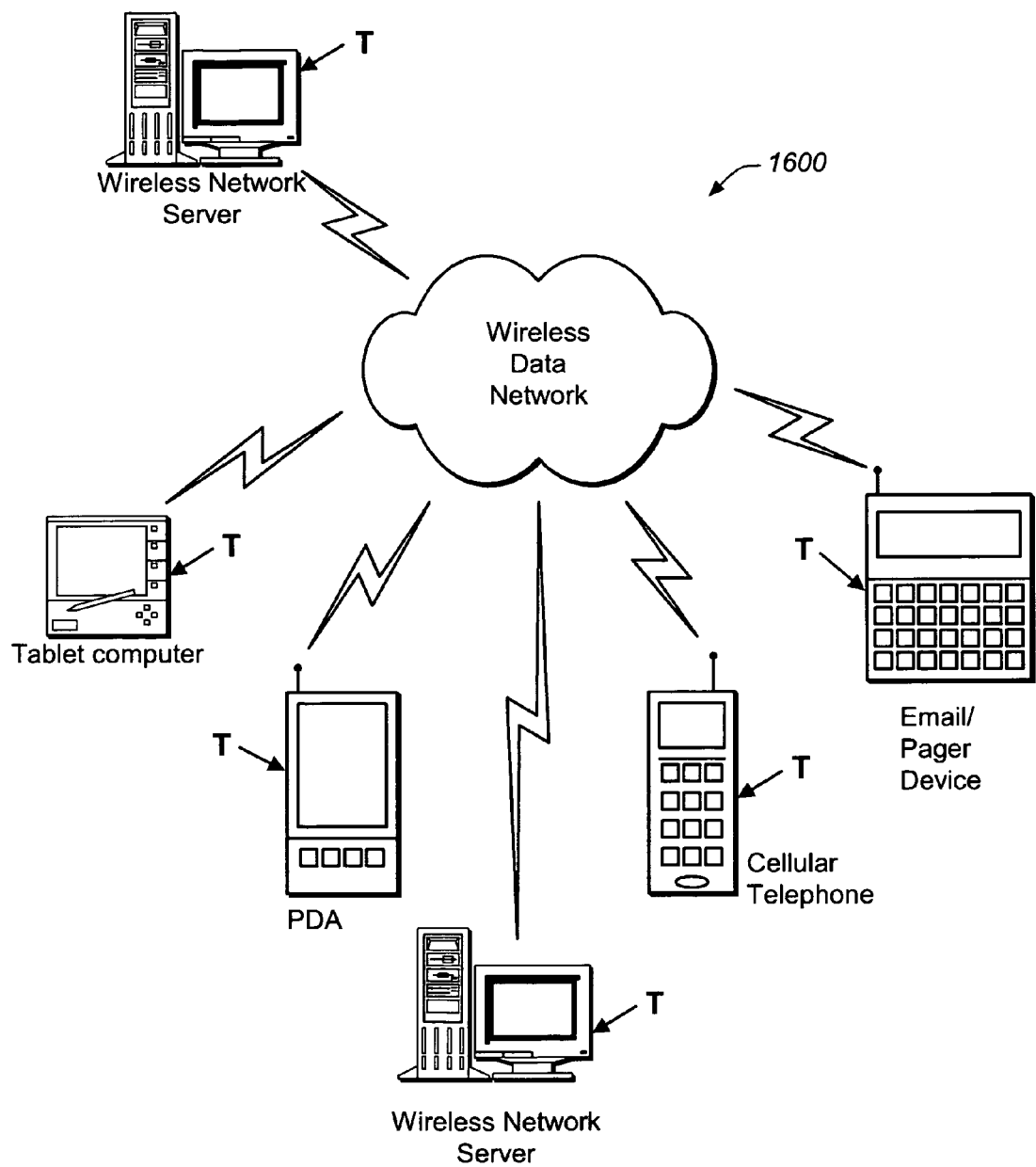
FIG. 16 shows a communication network that includes various communication devices that comprise one or more embodiments of a smart transmitter system.

FIG. 16 shows a communication network 1600 that includes various communication devices that include one or more embodiments of a smart transmitter system. The network 1600 includes multiple network servers, a tablet computer, a personal digital assistant (PDA), a cellular telephone, and an email/pager device all communicating over a wireless data network. Each of the devices includes one or more embodiments of a smart transmitter system (T) as described herein. The network 1600 illustrates only some of the devices that may comprise one or more embodiments of a smart transmitter system. However, it should be noted that one or more embodiments of a smart transmitter system are suitable for use in virtually any type of communication device.

In one or more embodiments, a smart transmitter system is provided that includes an automatic gain control (AGC) network that uses information about the transmit signal to set an operating bias of a power amplifier. Accordingly, while one or more embodiments of a smart transmitter system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for providing an automatic gain control circuit, the apparatus comprising:
   a circuit that translates a transmit power control signal to produce a linear signal;
   a first mapping circuit that maps the linear signal to a first control signal that is coupled to a variable gain amplifier; and
   a power amplifier control circuit that receives the linear signal and a transmit signal to produce a second control signal that is coupled to a linear mode power amplifier; wherein said second control signal is provided at least in part to set a minimum bias level of said linear mode power amplifier and said first control signal is provided at least in part to compensate for variations in the gain of said power amplifier.

2. The Apparatus of claim 1, wherein the power amplifier control circuit comprises a second mapping circuit that maps the linear signal to a power control signal.

3. The Apparatus of claim 2, wherein the power amplifier control circuit comprises a peak detector circuit that receives the transmit signal and produces a peak signal.

4. The Apparatus of claim 3, wherein the power amplifier control circuit comprises a signal combiner that combines the peak signal and the power control signal to produce the second control signal.

5. Apparatus for providing an automatic gain control circuit, the apparatus comprising:
   a circuit that translates a transmit power control signal to produce a linear signal;
   a first mapping circuit that maps the linear signal to a first control signal that is coupled to a variable gain amplifier, wherein the first mapping circuit comprises a square-root circuit; and
   a power amplifier control circuit that receives the linear signal and a transmit signal to produce a second control signal that is coupled to a power amplifier.

6. The Apparatus of claim 5, wherein the power amplifier control circuit comprises a second mapping circuit that maps the linear signal to a power control signal.

7. The Apparatus of claim 6, wherein the power amplifier control signal comprises a peak detector circuit that receives the transmit signal and produces a peak signal.

8. The Apparatus of claim 7, wherein the power amplifier control circuit comprises a signal combiner that combines the peak signal and the power control signal to produce the second control signal.

9. Apparatus for providing an automatic gain control circuit, the apparatus comprising:
   means for translating a transmit power control signal to produce a linear signal;
   means for mapping the linear signal to a first control signal that is coupled to a variable gain amplifier; and
   means for receiving the linear signal and a transmit signal to produce a second control signal that is coupled to a linear mode power amplifier, said second control signal provided at least in part to set a minimum bias level of said linear mode power amplifier and said first control signal is provided at least in part to compensate for variations in the gain of said power amplifier.

10. The Apparatus of claim 9, wherein the means for receiving comprises means for mapping the linear signal to a power control signal.

11. The Apparatus of claim 10, wherein the means for receiving comprises means for receiving the transmit signal and producing a peak signal.

12. The Apparatus of claim 11, wherein the means for receiving comprises means for combining the peak signal and the power control signal to produce the second control signal.

13. Apparatus for providing an automatic gain control circuit, the apparatus comprising:
   means for translating a transmit power control signal to produce a linear signal;
   means for mapping the linear signal to a first control signal that is coupled to a variable gain amplifier, wherein the means for mapping comprises a square-root circuit; and
   means for receiving the linear signal and a transmit signal to produce a second control signal that is coupled to a power amplifier.

14. The Apparatus of claim 13, wherein the means for receiving comprises means for mapping the linear signal to a power control signal.

15. The Apparatus of claim 14, wherein the means for receiving comprises means for receiving the transmit signal and producing a peak signal.

16. The Apparatus of claim 15, wherein the means for receiving comprises means for combining the peak signal and the power control signal to produce the second control signal.

17. A communication device comprising apparatus for providing an automatic gain control circuit, the apparatus comprising:
   a circuit that translates a transmit power control signal to produce a linear signal;
   a first mapping circuit that maps the linear signal to a first control signal that is coupled to a variable gain amplifier; and
   a power amplifier control circuit that receives the linear signal and a transmit signal to produce a second control signal that is coupled to a linear mode power amplifier, said second control signal provided at least in part to set a minimum bias level of said linear mode power amplifier.

18. The communication device of claim 17, wherein the power amplifier control circuit comprises a second mapping circuit that maps the linear signal to a power control signal.

19. The communication device of claim 18, wherein the power amplifier control circuit comprises a peak detector circuit that receives the transmit signal and produces a peak signal.

20. The communication device of claim 19, wherein the power amplifier control circuit comprises a signal combiner that combines the peak signal and the power control signal to produce the second control signal.

21. A communication device comprising apparatus for providing an automatic gain control circuit, the apparatus comprising:
   a circuit that translates a transmit power control signal to produce a linear signal;
   a first mapping circuit that maps the linear signal to a first control signal that is coupled to a variable gain amplifier, wherein the first mapping circuit comprises a square-root circuit; and
   a power amplifier control circuit that receives the linear signal and a transmit signal to produce a second control signal that is coupled to a power amplifier and said first control signal is provided at least in part to compensate for variations in said power amplifier gain.

22. The communication device of claim 21, wherein the power amplifier control circuit comprises a second mapping circuit that maps the linear signal to a power control signal.

23. The communication device of claim 22, wherein the power amplifier control circuit comprises a peak detector circuit that receives the transmit signal and produces a peak signal.

24. The communication device of claim 23, wherein the power amplifier control circuit comprises a signal combiner that combines the peak signal and the power control signal to produce the second control signal.

* * * * *